United States Patent
Kim

(10) Patent No.: US 8,184,012 B2
(45) Date of Patent: May 22, 2012

(54) AIR CONDITIONER AND REVERSE PHASE DETECTION METHOD THEREOF

(75) Inventor: Min Soo Kim, Changwon-si (KR)

(73) Assignee: LG Electronics Inc., Seoul (KR)

( * ) Notice: Subject to any disclaimer, the term of this patent is extended or adjusted under 35 U.S.C. 154(b) by 402 days.

(21) Appl. No.: 12/310,548

(22) PCT Filed: Nov. 7, 2007

(86) PCT No.: PCT/KR2007/005603
§ 371 (c)(1), (2), (4) Date: Jul. 21, 2009

(87) PCT Pub. No.: WO2008/056943
PCT Pub. Date: May 15, 2008

(65) Prior Publication Data
US 2010/0176959 A1    Jul. 15, 2010

(30) Foreign Application Priority Data
Nov. 7, 2006  (KR) .................. 10-2006-0109567

(51) Int. Cl.
*G08B 21/00*  (2006.01)
(52) U.S. Cl. .......................... 340/660; 324/66
(58) Field of Classification Search .......... 340/660; 62/126, 227; 324/66, 67; 318/400.02, 432, 318/803
See application file for complete search history.

(56) References Cited

U.S. PATENT DOCUMENTS

| 7,173,393 | B2* | 2/2007 | Maeda et al. | 318/400.02 |
| 7,626,350 | B2* | 12/2009 | Mori et al. | 318/432 |
| 7,816,903 | B2* | 10/2010 | Goto | 324/66 |
| 7,905,098 | B2* | 3/2011 | Pham | 62/227 |

FOREIGN PATENT DOCUMENTS

| JP | 2005-003626 | 1/2005 |
| KR | 10-2002-0007668 A | 1/2002 |
| KR | 10-2005-0105645 A | 11/2005 |
| KR | 10-2005-0120266 A | 12/2005 |

* cited by examiner

*Primary Examiner* — John A Tweel, Jr.
(74) *Attorney, Agent, or Firm* — McKenna Long & Aldridge LLP

(57) ABSTRACT

An air conditioner and a reverse-phase detection method thereof are provided. According to the air conditioner and the reverse-phase detection method thereof, it is possible to perform reverse-phase detection in real time by subtracting the voltage of one of two phases arbitrarily selected from the phases of an input three-phase alternating voltage from the voltage of the other phase and determining whether the input three-phase alternating voltage is reversed based on sign information of a voltage obtained by the subtraction. Thus, it is possible to prevent an air conditioner from malfunctioning due to a reversed input three-phase alternating voltage and to facilitate the management of an air conditioner.

15 Claims, 3 Drawing Sheets

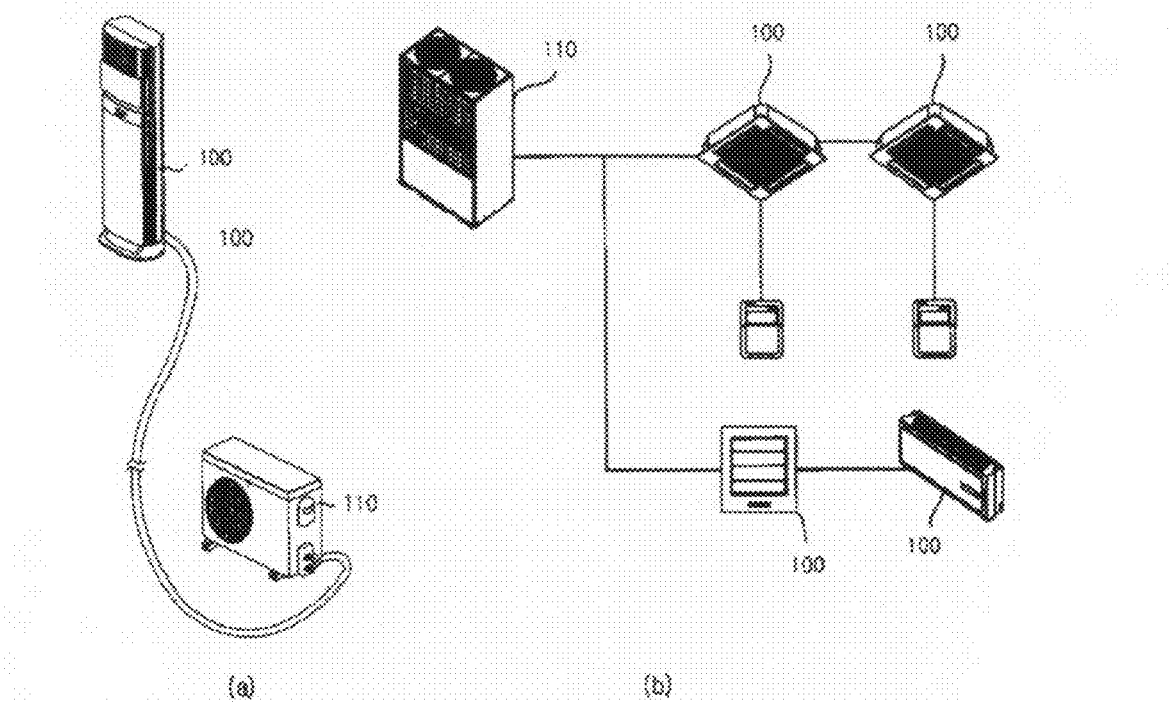
[Fig. 1]
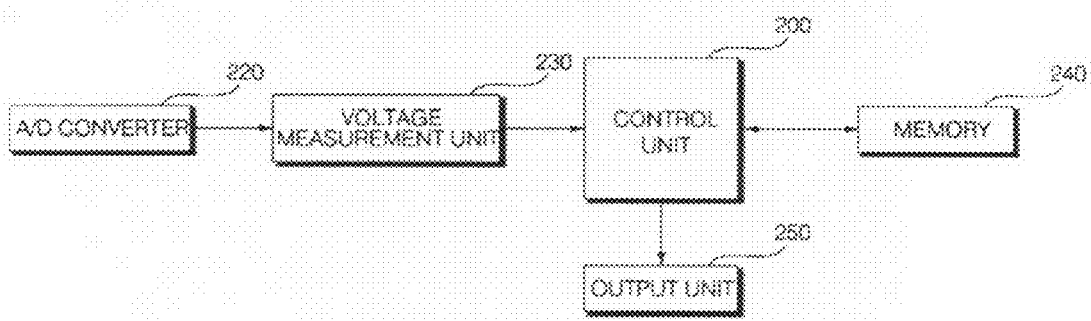
[Fig. 2]

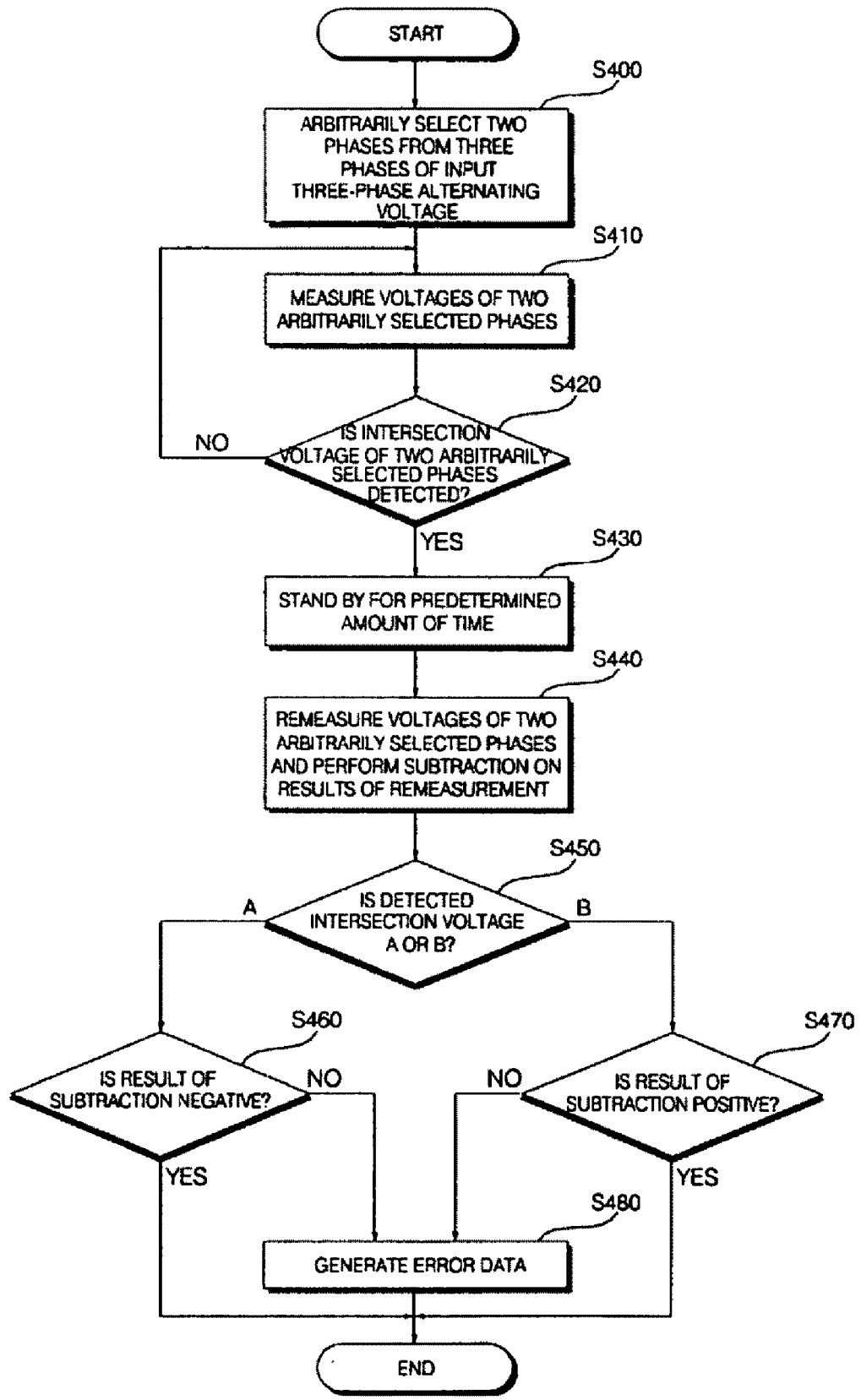
[Fig. 3]

[Fig. 4]
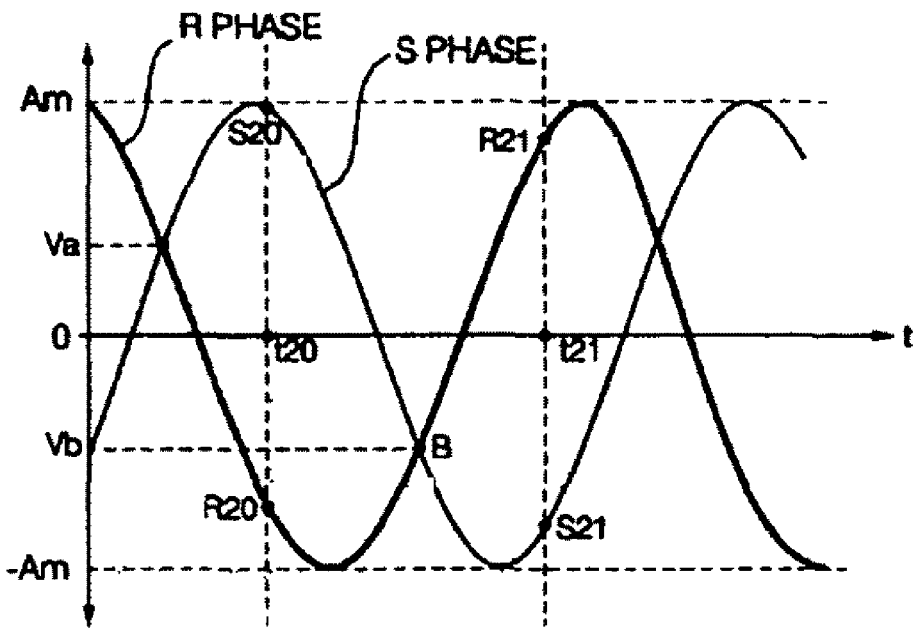
(a)
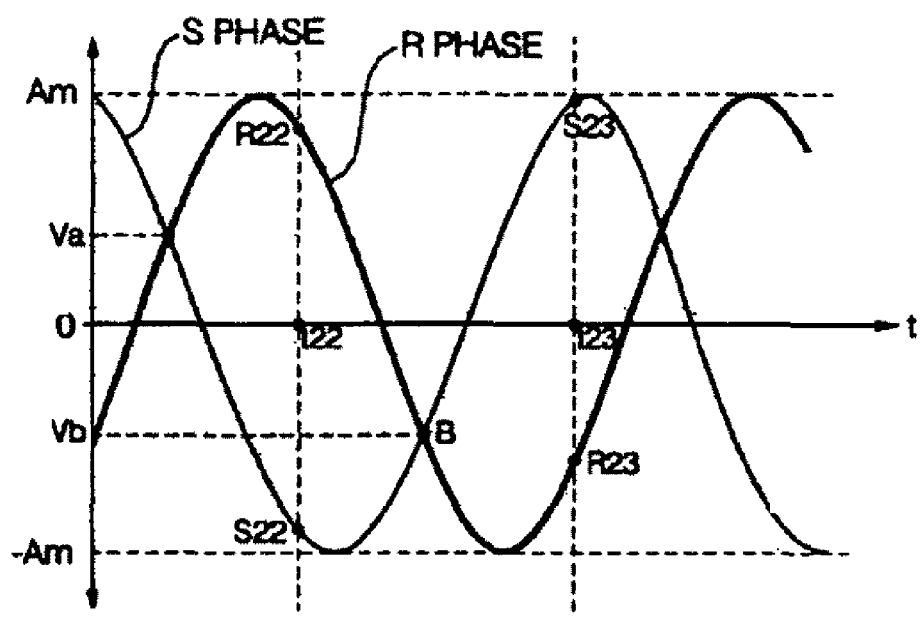
(b)

AIR CONDITIONER AND REVERSE PHASE DETECTION METHOD THEREOF

This application claims the benefit of PCT/KR2007/005603 filed on Nov. 7, 2007, and Korean Patent Application No. 10-2006-0109567 filed on Nov. 7, 2006, the contents of which are hereby incorporated herein by reference for all purposes in their entirety.

TECHNICAL FIELD

The present invention relates to an air conditioner and a reverse-phase detection method thereof, and more particularly, to an air conditioner and a reverse-phase detection method thereof in which it is determined whether an input three-phase alternating voltage is reversed.

BACKGROUND ART

In general, air conditioners include a heater, a cooler and an air purifier. Air conditioners are installed in a room and can establish an agreeable indoor environment by cooling or warming a room.

Air conditioners may perform a cooling operation or a heating operation by controlling the operation of a compressor according to the magnitude of an alternating voltage applied thereto, the temperature inside a room and a desired cooling/heating temperature. Here, the alternating voltage may be a three-phase alternating voltage having three phases: R, S and T phases.

Air conditioners may also include a reverse-phase detection circuit which performs reverse-phase detection on a three-phase alternating voltage and can thus prevent an air conditioner from malfunctioning due to a reverse phase of a three-phase alternating voltage.

However, in order to perform reverse-phase detection, conventional air conditioners need to extract the patterns of all three phases of an input alternating voltage and to compare the phases of the input alternating voltage. Thus, it takes time for conventional air conditioners to perform reverse-phase detection. Therefore, it is difficult for conventional air conditioners to perform reverse-phase detection on an input alternating voltage in real time.

DISCLOSURE OF INVENTION

Technical Problem

The present invention provides an air conditioner and a reverse-phase detection method thereof in which the voltages of any two of the three phases of an input three-phase alternating voltage are detected and it is determined whether the input three-phase alternating voltage is reversed based on the difference between the voltages of the two phases of the input three-phase alternating voltage.

Technical Solution

According to an aspect of the present invention, there is provided an air conditioner including a voltage measurement unit which measures the voltages of two phases arbitrarily selected from three phases of an input three-phase alternating voltage; and a control unit which obtains a first voltage by subtracting one of the measured voltages from the other measured voltage, compares sign information of the first voltage with initial sign information and determines whether the input three-phase alternating voltage is reversed based on the result of the comparison.

According to another aspect of the present invention, there is provided a reverse-phase detection method of an air conditioner, the reverse-phase detection method including measuring the voltages of two phases arbitrarily selected from three phases of an input three-phase alternating voltage; detecting an intersection voltage of the two arbitrarily selected phases, determining the sign of the intersection voltage, and storing the result of the determination of the sign of the intersection voltage as initial sign information, the intersection voltage being a voltage at the time when the two arbitrarily selected phases intersect each other, remeasuring the voltages of the two arbitrarily selected phases a predetermined amount of time after the two arbitrarily selected phases intersect each other, subtracting one of the remeasured voltages from the other remeasured voltage, determining the sign of a predetermined voltage obtained by the subtraction and providing sign information indicating the result of the determination of the sign of the predetermined voltage; and comparing the sign information with the initial sign information and determining whether the input three-phase alternating voltage is reversed based on the result of the comparison.

Advantageous Effects

According to the present invention, it is determined whether an input three-phase alternating voltage is reversed based on the difference between the voltages of two phases arbitrarily selected from the phases of the input three-phase alternating voltage. Thus, it is possible to facilitate the configuration of a reverse-phase detection circuit and program. In addition, it is possible to reduce the time taken to perform reverse-phase detection, perform reverse-phase detection in real time and maximize user convenience.

BRIEF DESCRIPTION OF THE DRAWINGS

The above and other features and advantages of the present invention will become more apparent by describing in detail preferred embodiments thereof with reference to the attached drawings in which:

FIG. 1 illustrates schematic diagrams of air conditioners according to an embodiment of the present invention;

FIG. 2 illustrates a reverse-phase detection circuit of an air conditioner, according to an embodiment of the present invention;

FIG. 3 illustrates a flowchart of a reverse-phase detection method of an air conditioner, according to an embodiment of the present invention; and FIG. 4 illustrates graphs of alternating voltages for explaining the reverse-phase detection method illustrated in FIG. 3.

BEST MODE FOR CARRYING OUT THE INVENTION

The present invention will hereinafter be described in detail with reference to the accompanying drawings in which exemplary embodiments of the invention are shown.

FIG. 1 illustrates schematic diagrams of air conditioners according to embodiments of the present invention. Referring to FIG. 1, each of the air conditioners may include one or more indoor units 100 and an outdoor unit 110. Each of the indoor units 100 includes an indoor heat exchanger (not shown), and the outdoor unit 110 which includes a compressor (not shown) and an outdoor heat exchanger (not shown).

During a heating operation, a coolant having a high temperature and high pressure is flown into the indoor heat exchanger by the compressor and discharges heat into the air that circulates in the indoor heat exchanger. As a result, warm air can be ejected from the indoor units 100.

During a cooling operation, a coolant having a low temperature and high pressure is flown into the indoor heat exchanger by the compressor and absorbs heat from the air that circulates in the indoor heat exchanger. As a result, cool air can be ejected from the indoor units 100.

The operation of the compressor may be appropriately controlled according to an input indoor temperature, a desired cooling/heating temperature, and the magnitude of an input alternating voltage so that either warm air or cool air can be ejected from the indoor units 100.

The air conditioners may also include a reverse-phase detection circuit (not shown). The reverse-phase detection circuit prevents a compressor from malfunctioning due to a reversed three-phase alternating voltage. The reverse-phase detection circuit may be connected to a power supply terminal to which a three-phase alternating voltage is input and may detect whether the three-phase alternating voltage is reversed. Thus, the reverse-phase detection circuit may be applied to any device to which a three-phase alternating voltage is input.

The present invention may be applied not only to an integral-type air conditioner into which an indoor unit 100 and an outdoor unit 110 are incorporated, as illustrated in FIG. 1(a), but also to a split-type air conditioner which includes one or more indoor units 100 and an outdoor unit 110 that are connected to one another, as illustrated in FIG. 1(b).

FIG. 2 illustrates a block diagram of a reverse-phase detection circuit of an air conditioner, according to an embodiment of the present invention. Referring to FIG. 2, the reverse-phase detection circuit includes a voltage measurement unit 230 which measures the voltages of three phases of an input three-phase alternating voltage; a control unit 200 which compares the results of the measurement and determines whether the input three-phase alternating voltage is reversed based on the result of the comparison; and an analog-to-digital (A/D) converter 220 which converts analog data regarding the input three-phase alternating phase into digital data and provides the digital data to the voltage measurement unit 230 and the control unit 200.

The reverse-phase detection circuit also includes an output unit 250 which outputs an error message according to the result of the determination performed by the control unit 200 and a memory 240 in which the results of the measurement performed by the voltage measurement unit 230 are stored.

The A/D converter 220 converts analog data regarding the input three-phase alternating voltage into digital data and transmits the digital data to the voltage measurement unit 230. More specifically, the A/D converter 220 converts the analog waveform of the voltages of the phases of the input three-phase alternating voltage into digital data and allows the digital data to be continuously input to the voltage measurement unit 230.

Two phases arbitrarily selected from three phases (i.e., R, S and T phases) of the input three-phase alternating voltage may be applied to the A/D converter 220. Alternatively, the phases of the input three-phase alternating voltage may all be applied to the A/D converter 220, and then, the A/D converter 220 may digitalize analog voltage waveform data regarding all the phases of the input three-phase alternating voltage and transmit the digitalized data to the voltage measurement unit 230.

A voltage within the range of 0-5 V or 0-2.5 V may be input to the voltage measurement unit 230 by the A/D converter 220. The range of voltages that can be input to the voltage measurement unit 230 by the A/D converter 220 may be altered.

The voltage measurement unit 230 performs voltage measurement based on digital data provided by the A/D converter 220 regarding the waveforms of the voltages of the phases of the input three-phase alternating voltage. Then, the voltage measurement unit 230 applies the results of the voltage measurement to the control unit 200.

The output unit 250 may include at least one of a speaker which outputs sounds, a display panel which outputs text data or images, and a warning light which can be turned on or off. If the control unit 200 determines the input three-phase alternating voltage to be reversed, the output unit 250 may outputs error data. At least one of an alarm sound, an error code and a flicker signal may be output as the error data.

The memory 240 stores pulse information of the phases of the input three-phase alternating voltage and the voltage (hereinafter referred to as the intersection voltage) at the time when two phases arbitrarily selected from the three phases of the input three phase alternating voltage intersect each other. More specifically, the memory 240 may store sign information indicating the sign of the result of subtracting the voltage of one of the two arbitrarily selected phases from the voltage of the other arbitrarily selected phase. The two arbitrarily selected phases may be R and S phases, S and T phases or T and R phases. Information regarding each of R, S and T phases may be stored in the memory 240.

The control unit 200 determines whether the phases of the input three-phase alternating voltage all have the same voltage. If two of the three phases of the input three-phase alternating voltage have the same voltage, the control unit 200 may store the corresponding voltage in the memory 240. More specifically, if two of the three phases of the input three-phase alternating voltage have the same voltage, the control unit 200 compares the intersection voltage of the two phases with a reference voltage. If the intersection voltage of the two phases is higher than the reference voltage, the control unit 200 may store sign information representing a positive value in the memory 240 as initial sign information. On the other hand, if the voltage at the intersection between the two phases is lower than the reference voltage, the control unit 200 may store sign information representing a negative value in the memory 240 as the initial sign information.

A value of 1 or 0 may be stored in the memory 240 as the initial sign information. That is, if the intersection voltage of the two phases is higher than the reference voltage, the control unit 200 may store a value of 0 in the memory 240 as the initial sign information. On the other hand, if the intersection voltage of the two phases is lower than the reference voltage, the control unit 200 may store a value of 0 as the initial sign information. Symbols or numerical values, other than the value of 1 or 0, may be stored as sign information. The reference voltage may be set to the median of the highest and lowest levels of the input three-phase alternating voltage. If the highest and lowest levels of the input three-phase alternating voltage are 5 V and 0 V, respectively, the reference voltage may be set to 2.5 V. If the highest and lowest levels of the input three-phase alternating voltage are 2.5 V and 0 V, respectively, the reference voltage may be set to 1.25 V. If the highest and lowest levels of the input three-phase alternating voltage are 5 V and −5 V, respectively, the reference voltage may be set to 0 V.

Once sign information of an intersection voltage of two of the phases of the input three-phase alternating voltage is stored in the memory 240 as the initial sign information, the control unit 200 receives the voltages of the two phases from the voltage measurement unit 230 a predefined amount of time after the voltages of the two phases become identical, i.e., after the intersection voltage of the two phases is detected. Then, the control unit 200 compares the received voltages and calculates the difference between the received voltages. The predetermined amount of time may vary according to the period of the input three-phase alternating voltage. The voltages of the two phases may be measured again before a new intersection voltage of the two phases is detected. Therefore, the predetermined amount of time may be set to less than half the period of the input three-phase alternating voltage.

The control unit 200 compares the voltages of two of the phases of the input three-phase alternating voltage and generates sign information of the difference between the voltages of the two phases. More specifically, if the result of subtracting the voltage of one of the two phases from the voltage of the other phase is positive, the control unit 200 may provide a value of 1 as sign information. On the other hand, if the result of subtracting the voltage of one of the two phases from the voltage of the other phase is negative, the control unit 200 may provide a value of 0 as sign information. If the voltages of the two phases are both within the range of 0-5 V, the control unit 200 may compare a predetermined voltage obtained by subtracting the voltage of one of the two phases from the voltage of the other phase with a reference voltage and determine the sign of the predetermined voltage based on the result of the comparison.

If two phases arbitrarily selected from the phases of the input three-phase alternating voltage are R and S phases, the control unit 200 may subtract the voltage of the S phase from the voltage of the R phase. If the two arbitrarily selected phases are S and T phases, the control unit 200 may subtract the voltage of the T phase from the voltage of the S phase. If the two arbitrarily selected phases are R and T phases, the control unit 200 may subtract the voltage of the T phase from the voltage of the R phase. If the two arbitrarily selected phases are S and R phases, the control unit 200 may subtract the voltage of the T phase from the voltage of the S phase.

The control unit 200 determines whether the input three-phase alternating voltage is reversed by comparing the initial sign information present in the memory 240 with sign information of the result of subtracting the voltage of one of the two arbitrarily selected phases from the other arbitrarily selected phase.

If the initial sign information present in the memory 240 is the same as the sign information of the result of subtracting the voltage of one of the two arbitrarily selected phases from the other arbitrarily selected phase, the control unit 200 may determine the input three-phase alternating voltage to be a reversed voltage, generate error data, and control the operation of the air conditioner. On the other hand, if the initial sign information present in the memory 240 is the same as the sign information of the result of subtracting the voltage of one of the two arbitrarily selected phases from the other arbitrarily selected phase, the control unit 200 may determine the input three-phase alternating voltage to be a non-reversed normal voltage and enable the air conditioner to operate normally.

More specifically, if the initial sign information present in the memory 240 has a value of 1 and the sign information of the result of subtracting the voltage of one of the two arbitrarily selected phases from the other arbitrarily selected phase has a value of 0, the control unit 200 may determine that the input three-phase alternating voltage is normal. On the other hand, if the initial sign information present in the memory 240 has a value of 1 and the sign information of the result of subtracting the voltage of one of the two arbitrarily selected phases from the other arbitrarily selected phase has a value of 1, the control unit 200 may determine that the input three-phase alternating voltage is reversed.

If the input three-phase alternating voltage is determined to be reversed, the control unit 200 may generate error data and control the output unit 250 to output the error data.

FIG. 3 illustrates a flowchart of a reverse-phase detection method of an air conditioner, according to an embodiment of the present invention. Referring to FIG. 3, an air conditioner may store information regarding a normal three-phase alternating voltage having three phases: R, S and T phases.

Then, the air conditioner stores an intersection voltage of two phases that are arbitrarily selected from the phases of the normal three-phase alternating voltage, and compares the intersection voltage with a reference voltage. Thereafter, the air conditioner stores sign information obtained by the comparison in the memory 240 as initial sign information. For example, an intersection voltage of at least one of R and S phases, S and T phases and T and R phases and sign information of the intersection voltage may be stored in the memory 240.

Two of the phases of a three-phase alternating voltage intersect each other twice during one period of the three-phase alternating voltage. Thus, a total of two intersection voltages are detected during one period of a three-phase alternating voltage. Whichever of the two intersection voltages is higher than a reference voltage and is thus determined to be positive is referred to as intersection voltage A, and the other intersection voltage, which is lower than the reference voltage and is thus determined to be negative, is referred to as intersection voltage B. Then, sign information of intersection voltages A and B is stored in the memory 240 as initial sign information. Referring to FIG. 3, two phases that are arbitrarily selected from the phases of an input three-phase alternating voltage are input to the A/D converter 220 (S400). The voltage measurement unit 230 measures the voltages of the two arbitrarily selected phases and applies the results of the measurement to the control unit 200 (S410).

If an intersection voltage of the two arbitrarily selected phases is detected (S420), the control unit 200 compares the intersection voltage with a reference voltage, determines the sign of the intersection voltage based on the result of the comparison, and stores the result of the determination in the memory 240 as initial sign information. If the intersection voltage is higher than the reference voltage, it is determined that intersection voltage A has been detected, and a value of 1 may be stored in the memory 240 as the initial sign information because intersection voltage A is positive. On the other hand, if the intersection voltage is lower than the reference voltage, it is determined that intersection voltage B has been detected, and a value of 0 may be stored in the memory 240 as the initial sign information because intersection voltage B is negative.

The voltage measurement unit 230 remeasures the voltages of the two arbitrarily selected phases a predetermined amount of time after the detection of the intersection voltage (S430) of the two arbitrarily selected phases, and provides the remeasured voltages to the control unit 200. Then, the control unit 200 subtracts one of the remeasured voltages from the other remeasured voltage (S440). The predetermined amount of time may be the time taken to detect a new intersection voltage of the two arbitrarily selected phases. The predetermined amount of time may be set to less than half the period of the input three-phase alternating voltage.

The control unit 200 determines whether the input three-phase alternating voltage is reversed based on the sign of the result of the subtraction performed in operation S440. More specifically, the control unit 200 determines whether the intersection voltage obtained in operation S420 is intersection voltage A or intersection voltage B (S450), i.e., whether the initial sign information present in the memory 240 has a value of 1 or 0.

If the initial sign information present in the memory 240 has a value of 1, the intersection voltage obtained in operation S420 may be determined to be intersection voltage A. Thus, if the result of the subtraction performed in operation S440 is negative and thus sign information of the result of the subtraction performed in operation S440 has a value of 0 (S460), the control unit 200 may determine that the input three-phase alternating voltage is normal. However, if the result of the subtraction performed in operation 5440 is positive and thus sign information of the result of the subtraction performed in operation S440 has a value of 1 (S460), the control unit 200 may determine that the input three-phase alternating voltage is reversed.

On the other hand, if the initial sign information present in the memory 240 has a value of 0, the intersection voltage obtained in operation S420 may be determined to be intersection voltage B. Thus, if the result of the subtraction performed in operation S440 is positive and thus sign information of the result of the subtraction performed in operation S440 has a value of 1 (S470), the control unit 200 may determine that the input three-phase alternating voltage is normal. However, if the result of the subtraction performed in operation S440 is negative and thus sign information of the result of the subtraction performed in operation S440 has a value of 0 (S470), the control unit 200 may determine that the input three-phase alternating voltage is reversed.

That is, if the sign information of the result of the subtraction performed in operation S440 has a different value from the initial sign information present in the memory 240, the control unit 200 may determine that the input three-phase alternating voltage is normal. On the other hand, if the sign information of the result of the subtraction performed in operation S440 has the same value as the initial sign information present in the memory 240, the control unit 200 may determine that the input three-phase alternating voltage is reversed.

If the input three-phase alternating voltage is determined to be reversed, the control unit 200 generates error data and controls the output unit 250 to output the error data (S480). The output unit 250 may output an alarm sound through a speaker as the error data or may display an error code on the screen of a display panel as the error data. Alternatively, the output unit 250 may turn on or off a lamp.

FIG. 4 illustrates three-phase alternating voltages for explaining the reverse-phase detection method illustrated in FIG. 3. More specifically, FIG. 4(a) illustrates a normal three-phase alternating voltage, and FIG. 4(b) illustrates a reversed three-phase alternating voltage.

In the embodiment of FIG. 3, two phases are arbitrarily selected from three phases of an input three-phase alternating voltage, and the voltages of the two arbitrarily selected phases are measured. The two arbitrarily selected phases may be R and S phases, as illustrated in FIG. 4.

Referring to FIG. 4(a), the control unit 200 detects an intersection voltage of R and S phases. Then, the control unit 200 compares the detected intersection voltage with a reference voltage and determines whether the detected intersection voltage is intersection voltage A or B based on the result of the comparison. More specifically, if the detected intersection voltage is Va, which is higher than the reference voltage, the control unit 200 may determine that intersection voltage A has been detected. On the other hand, if the detected intersection voltage is Vb, which is lower than the reference voltage, the control unit 200 may determine that intersection voltage B has been detected.

In addition, the control unit 200 determines the sign of the detected intersection voltage and stores the result of the determination in the memory 240 as initial sign information. More specifically, if it is determined that intersection voltage A has been detected, the control unit 200 may store a value of 1 in the memory 240 as the initial sign information. On the other hand, if it is determined that intersection voltage B has been detected, the control unit 200 may store a value of 0 in the memory 240 as the initial sign information. The reference voltage may be the median of highest and lowest levels of the input three-phase alternating voltage. Referring to FIG. 4(a), the highest and lowest levels of the input three-phase alternating voltage are Am and −Am, respectively, and thus, the reference voltage may be 0.

If it is determined that intersection voltage A has been detected, the voltages of the R and S phases may be remeasured a predetermined amount of time after the detection of intersection voltage A, for example, at a time t20, and subtraction may be performed on the results of the remeasurement, i.e., voltages R20 and S20. More specifically, the voltage S20 is subtracted from the voltage R20, thereby obtaining a voltage difference R20-S20. If the voltage difference R20-S20 is positive, a value of 1 may be designated as sign information of the voltage difference R20-S20. On the other hand, if the voltage difference R20-S20 is negative, a value of 1 may be designated as the sign information of the voltage difference R20-S20.

The control unit 200 compares the initial sign information present in the memory 240 with the sign information of the voltage difference R20-S20 and determines whether the input three-phase alternating voltage is reversed based on the result of the comparison.

If intersection voltage A is detected, the control unit 200 may store sign information representing a positive value in the memory 240 as the initial sign information. In this case, the control unit 200 may determine the input three-phase alternating voltage to be normal if the voltage difference R20-S20 is negative, and determine the input three-phase alternating voltage to be reversed if the voltage difference R20-S20 is positive. That is, if the sign information of the voltage difference R20-S20 is different from the initial sign information present in the memory 240, the control unit 200 may determine that the input three-phase alternating voltage is normal. On the other hand, if the sign information of the voltage difference R20-S20 is the same as the initial sign information present in the memory 240, the control unit 200 may determine that the input three-phase alternating voltage is reversed. Since the voltage difference R20-S20 is positive, the control unit 200 determines that the input three-phase alternating voltage is normal.

Likewise, if intersection voltage B is detected, the control unit 200 may store sign information representing a negative value in the memory 240 as the initial sign information. Then, the voltages of the R and S phases are remeasured a predetermined amount of time after the detection of intersection voltage B, for example, at a time t21, and subtraction may be performed on the results of the remeasurement, i.e., voltages R21 and S21. More specifically, the voltage S21 is subtracted from the voltage R21, thereby obtaining a voltage difference R21-S21. Since the initial sign information present in the memory 240 represents a negative value and the voltage difference R21-S21 is positive, the control unit 200 determines that the input three-phase alternating voltage is normal.

Referring to FIG. 4(b), if an intersection voltage of R and S phases of an input three-phase alternating voltage is Va, the control unit 200 determines that intersection voltage A has been detected, and stores sign information representing a positive value in the memory 240 as initial sign information. Then, the voltages of the R and S phases are remeasured a predetermined amount of time after the detection of intersection voltage A, for example, at a time t22, and subtraction is performed on the results of the remeasurement, i.e., R22 and S22, thereby obtaining a voltage difference R22-S22. Since the initial sign information present in the memory 240 represents a positive value and the voltage difference R22-S22 is positive, the control unit 200 determines that the input three-phase alternating voltage is reversed, and generates error data.

If the intersection voltage of the R and S phases is Vb, the control unit 200 determines that intersection voltage B has been detected, and stores sign information representing a negative value in the memory 240 as initial sign information. Then, the voltages of the R and S phases are remeasured a predetermined amount of time after the detection of intersection voltage B, for example, at a time t23, and subtraction is performed on the results of the remeasurement, i.e., R23 and S23, thereby obtaining a voltage difference R23-S23. Since the initial sign information present in the memory 240 represents a negative value and the voltage difference R23-S23 is negative, the control unit 200 determines that the input three-phase alternating voltage is reversed, and generates error data.

While the present invention has been particularly shown and described with reference to exemplary embodiments thereof, it will be understood by those of ordinary skill in the art that various changes in form and details may be made therein without departing from the spirit and scope of the present invention as defined by the following claims.

Industrial Applicability

According to the present invention, it is possible to determine in real time whether an input three-phase alternating voltage is reversed based on the difference between the voltages of two phases arbitrarily selected from the phases of the input three-phase alternating voltage.

The invention claimed is:

1. An air conditioner comprising:
a voltage measurement unit which measures the voltage of two phases arbitrarily selected from three phases of an input three-phase alternating voltage; and
a control unit which obtains a first voltage by subtracting one of the measured voltages from the other measured voltage, compares sign information of the first voltage with initial sign information and determines whether the input three-phase alternating voltage is reversed based on the result of the comparison.

2. The air conditioner of claim 1, further comprising a memory which stores an intersection voltage of the two arbitrarily selected phases and sign information of the intersection voltage at the time when the two arbitrarily selected phases intersect each other.

3. The air conditioner of claim 2, wherein the voltage measurement unit remeasures the voltage of the two arbitrarily selected phases a predetermined amount of time after the two arbitrarily selected phases intersect each other, and the control unit obtains a second voltage by subtracting one of the remeasured voltages from the other remeasured voltage, and determines the input three-phase alternating voltage is reversed if sign information of the second voltage is the same as the initial sign information.

4. The air conditioner of claim 3, wherein the control unit determines the second voltage to be positive if the second voltage is higher than a reference voltage and determines the second voltage to be negative if the second voltage is lower than the reference voltage.

5. The air conditioner of claim 4, wherein the reference voltage is the median of highest and lowest levels of the input three-phase alternating voltage.

6. The air conditioner of claim 3, wherein the predetermined amount of time is less than half the period of the input three-phase alternating voltage.

7. The air conditioner of claim 1, further comprising an analog-to-digital (A/D) converter which converts the input three-phase alternating voltage into digital data and transmits the digital data to the voltage measurement unit.

8. The air conditioner of claim 1, wherein, if the input three-phase alternating phase is determined to be reversed, the control unit outputs error data comprising at least one of an alarm sound error code.

9. The air conditioner of claim 8, further comprising an output unit which outputs the error data.

10. A reverse-phase detection method of an air conditioner, the reverse-phase detection method comprising:
measuring the voltage of two phases arbitrarily selected from three-phases of an input three-phase voltage;
detecting an intersection voltage of the two arbitrarily selected phases, determining the sign of the intersection voltage, and storing the result of the determination of the sign of the intersection voltage as initial sign information, the intersection voltage being a voltage at the time when two arbitrarily selected phases intersect each other;
remeasuring the voltages of the two arbitrarily selected phases a predetermined amount of time after the two arbitrarily selected phases intersect each other, subtracting one of the remeasured voltages from the other measured voltage, determining the sign of a predetermined voltage obtained by the subtraction and providing sign information indicating the result of the determination of the sign of the predetermined voltage; and
comparing the sign information with the initial sign information and determining whether the input three-phase alternating voltage is reversed based on the result of the comparison.

11. The reverse-phase detection method of claim 10, wherein the determining whether the input three-phase alternating voltage is reversed, comprises:
determining the input three-phase alternating voltage to be reversed if the sign information is the same as the initial sign information; and
determining the input three-phase alternating voltage to be normal if the sign information is different from the initial sign information.

12. The reverse-phase detection method of claim 10, wherein the determining whether the input three-phase alternating voltage is reversed, comprises outputting error data comprising at least one of an alarm sound and error code if the input three-phase alternating voltage is determined to be reversed.

13. The reverse-phase detection method of claim 10, wherein the predetermined amount of time is less than half the period of the input three-phase alternating voltage.

14. The reverse-phase detection method of claim 10, wherein the determining the sign of the predetermined voltage, comprises:

determining the predetermined voltage to be positive if the predetermined voltage is higher than a reference voltage; and determining the predetermined voltage to be negative if the predetermined voltage is lower than the reference voltage.

15. The reverse-phase detection method of claim 14, wherein the reference voltage is the median of highest and lowest levels of the input three-phase alternating voltage.

* * * * *